(12) United States Patent
Engler et al.

(10) Patent No.: US 6,975,136 B2
(45) Date of Patent: Dec. 13, 2005

(54) ISOLATED CHANNEL IN AN INTEGRATED CIRCUIT

(75) Inventors: David W. Engler, Cypress, TX (US); David F. Heinrich, Tomball, TX (US); Barry Basile, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 78 days.

(21) Appl. No.: 10/393,191

(22) Filed: Mar. 20, 2003

(65) Prior Publication Data

US 2004/0183567 A1 Sep. 23, 2004

(51) Int. Cl.⁷ .................... H03K 17/16; H03K 19/003; G06F 9/45
(52) U.S. Cl. ........................... 326/34; 716/5
(58) Field of Search ................ 326/34, 21; 345/58; 386/115, 22; 348/609; 327/551; 398/39; 716/5, 6

(56) References Cited

U.S. PATENT DOCUMENTS

| | | | | |
|---|---|---|---|---|
| 3,189,758 A | * | 6/1965 | Bell | 327/124 |
| 4,459,621 A | * | 7/1984 | Okano | 386/115 |
| 4,649,505 A | * | 3/1987 | Zinser et al. | 379/406.08 |
| 4,845,482 A | * | 7/1989 | Howard et al. | 345/58 |
| 5,003,512 A | * | 3/1991 | Geddes | 365/189.09 |
| 5,808,502 A | * | 9/1998 | Hui et al. | 327/333 |
| 5,818,884 A | * | 10/1998 | Reymond | 375/354 |
| 5,835,049 A | * | 11/1998 | Nagaraj | 341/161 |
| 5,870,573 A | * | 2/1999 | Johnson | 710/316 |
| 5,914,844 A | * | 6/1999 | Lutley et al. | 361/111 |
| 6,184,702 B1 | * | 2/2001 | Takahashi et al. | 326/21 |
| 6,189,058 B1 | | 2/2001 | Jones, III et al. | |
| 6,236,585 B1 | * | 5/2001 | Hill | 365/49 |
| 6,401,157 B1 | | 6/2002 | Nguyen et al. | |
| 6,452,424 B1 | * | 9/2002 | Shamlou et al. | 327/91 |
| 6,507,935 B1 | * | 1/2003 | Aingaran et al. | 716/5 |
| 6,511,884 B1 | * | 1/2003 | Quek et al. | 438/268 |
| 6,536,022 B1 | * | 3/2003 | Aingaran et al. | 716/5 |
| 6,538,780 B1 | * | 3/2003 | Murphy et al. | 398/39 |
| 6,574,128 B1 | * | 6/2003 | Morgan | 365/72 |
| 6,664,839 B2 | * | 12/2003 | Ootake et al. | 327/292 |
| 6,807,236 B1 | * | 10/2004 | Fujimura | 375/285 |

FOREIGN PATENT DOCUMENTS

EP 740346 * 10/1996

* cited by examiner

*Primary Examiner*—Patrick Wamsley

(57) ABSTRACT

A semiconductor package contains at least one electrically isolated channel. The isolated channel is minimally susceptible to crosstalk from other channels in the package. Specifically, the level of crosstalk that may impinge on the isolated channel is below an acceptable threshold so as to permit the isolated channel to function correctly. The semiconductor package may be a FET switch assembly and the isolated channel may be used for a clock signal to prevent crosstalk contamination caused by the data signals.

14 Claims, 4 Drawing Sheets

ISOLATED CHANNEL IN AN INTEGRATED CIRCUIT

BACKGROUND

An issue that many electronic designers are faced with is "crosstalk." Crosstalk refers to electromagnetic radiation produced by one electrical signal path that induces an undesirable current in another signal path. Crosstalk manifests itself as "noise" on the affected signal path. Depending on the application, the type of information encoded in the signals, and other factors, crosstalk can be disruptive and even disabling to an electronic device or system.

BRIEF SUMMARY

An integrated circuit is disclosed that contains at least one electrically isolated channel. The integrated circuit may include a first transistor, a second transistor, and a third transistor. The second transistor may be disposed between the first and third transistors. A terminal of the second transistor may be grounded precluding the second transistor from being used as a switch.

BRIEF DESCRIPTION OF THE DRAWINGS

For a detailed description of the exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment.

In accordance with exemplary embodiments of the invention, an integrated circuit may include a plurality of conductive pathways (generally referred to as "channels") with at least one channel being isolated from the other channels. Without limitation, the integrated circuit may comprise a multi-channel FET switch assembly which may include an isolated channel. "Isolated" in this context means that radiated electromagnetic energy from the non-isolated channels in the FET switch assembly may not detrimentally affect the isolated channel, or at least interfere with the isolated channel below an acceptable level. FIGS. 1–8 depict various embodiments of a FET switch with one or more isolated channels. The multi-channel FET switch assembly described herein may be used in a variety of applications such as to implement "hot plug" capabilities in a computer system. Without loss of generality, the following discussion is directed to FET switch assemblies with at least one isolated channel, but the principles discussed herein may apply to a variety of integrated circuits.

Figure 1:
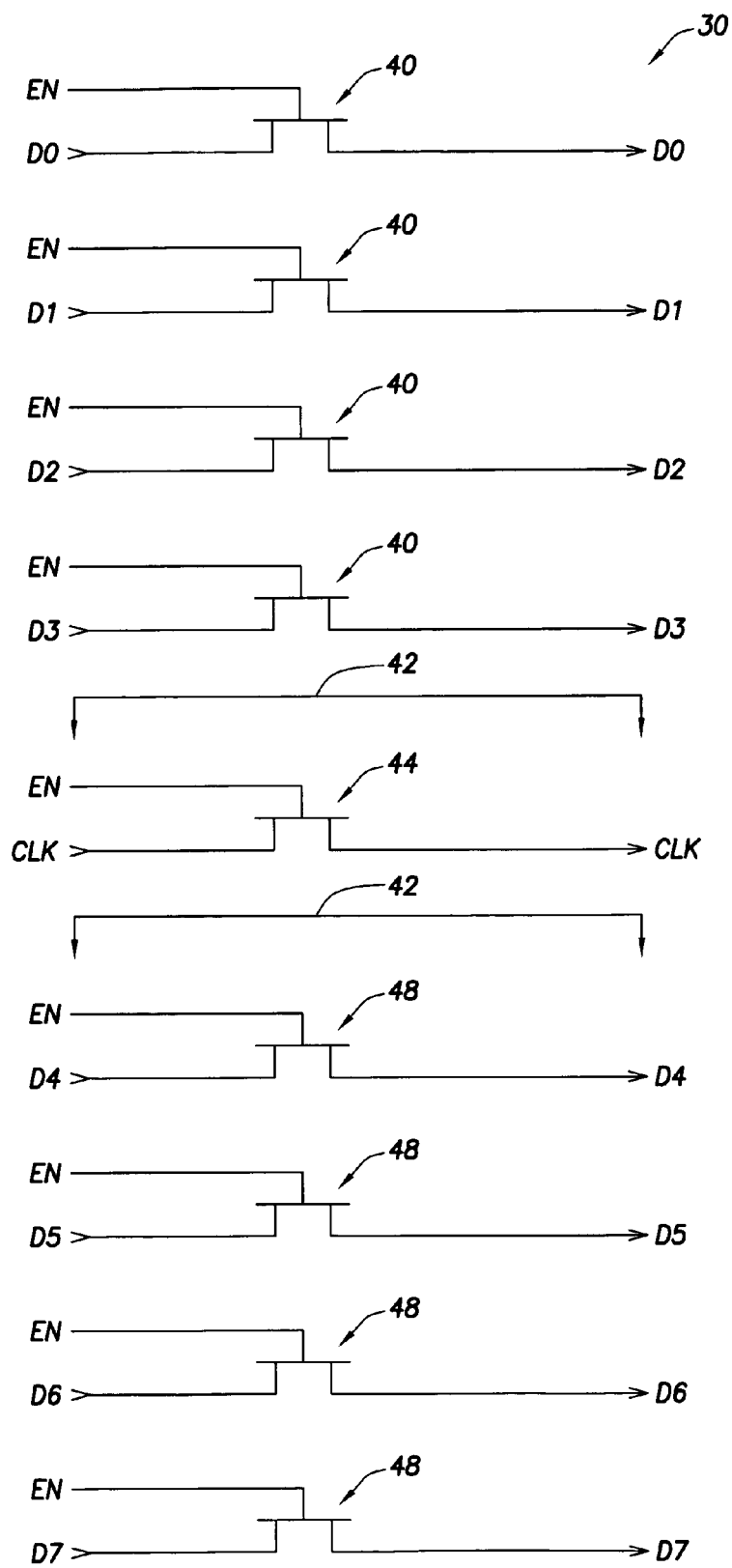
FIG. 1 shows a FET switch assembly containing an electrically isolated channel in accordance with various embodiments of the invention.

Referring now to FIG. 1, an exemplary embodiment of a FET switch assembly 30 is shown comprising eight channels D0–D7 (although the number of channels is not significant and may be 2 or more). The assembly 30 may also include an isolated channel designated for use as a clock ("CLK") channel. Each channel may include at least one field effect transistor ("FET") 40 that permits an incoming bit to be switched through the assembly to an output terminal or pin. The signals being switched may comprise data signals, clock signals or other types of signals. In some embodiments, the isolated channel may comprise a FET switch usable for a clock signal and the other channels may be usable for data signals (D0–D7). An enable ("EN") signal causes each FET switch 40 to be connected or disconnected as desired by external logic (not shown). One of ordinary skill in the art will appreciate that there are numerous embodiments of FET switches and each channel may include more than one FET switch or have a different switch architecture from that shown in FIG. 1. In general, the FET switch assembly 30 may comprise a semiconductor die contained within a suitable package.

In accordance with various embodiments, the clock ("CLK") channel may be isolated from the other data channels D0–D7. The isolation may be provided by sandwiching the clock channel, which may include FET 44, between two ground conductive pathways 42. Conductive pathways may be implemented as traces internal to the FET switch assembly 30. The ground pathways 42 provide shielding for the clock channel to reduce the amount of noise generated by the various data channels from impinging on the clock channel.

Figure 2:
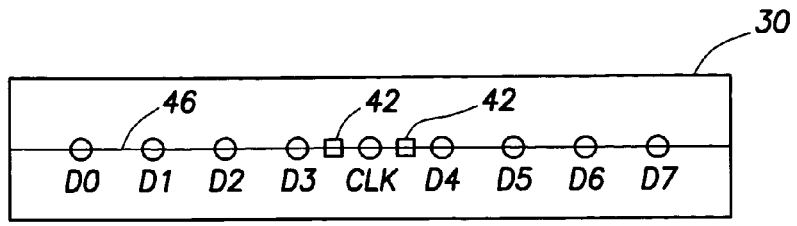
FIG. 2 shows an exemplary orientation of the isolated channel within the assembly in accordance with various embodiments of the invention.

FIG. 2 shows a side view of FET switch 30. In this exemplary embodiment, the various data channels D0–D7 and clock channel all may be formed on substantially the same layer 46 of the FET switch die. In other embodiment, the FETs 40 and 44 may be formed across more than one layer. The isolated clock channel is shown formed between two groups of four data channels as shown (D0–D3 and D4–D7).

Figure 3:
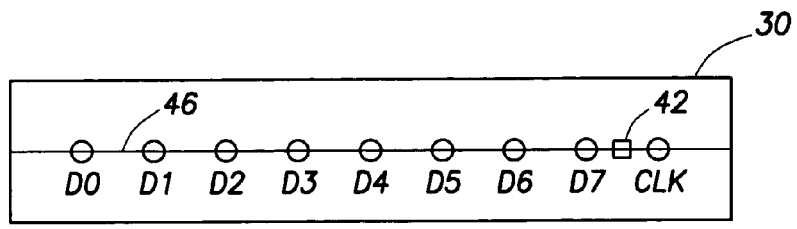
FIG. 3 shows an alternative orientation for the isolated channel in accordance with various embodiments of the invention.

In FIG. 3, the isolated clock channel may be formed at one end of the FET switch die to help increase the distance between the clock channel and the data channels. Separating the clock channel from the data channels reduces the magnitude of any crosstalk generated by the data channels by the time such crosstalk may reach the clock channel. The separation between isolated clock channel and the data channels may be 3 to 10 times the distance from the clock channel to the nearest conductive reference layer (e.g., ground layer or substrate).

Figure 4:
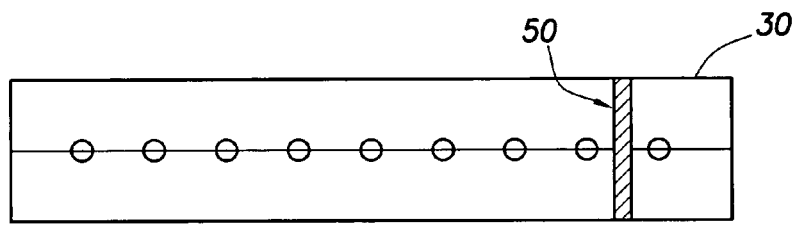
FIG. 4 shows an embodiment using a relatively low K dielectric to help provide isolation.

The embodiment of FIG. 4 may be similar to that of FIG. 3. Instead of using a ground trace 42 to help isolate the clock channel, a dielectric 50 having a relatively low permitivity may be included. The dielectric 50 may be formed in accordance with any acceptable technique.

Figure 5:
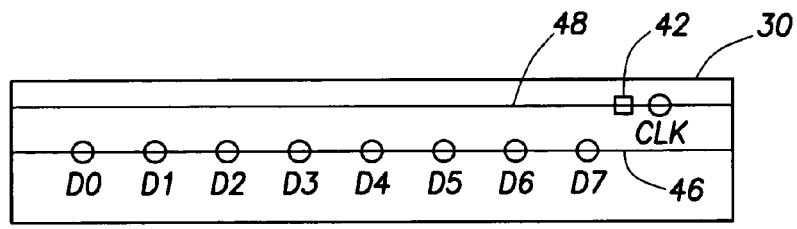
FIG. 5 shows an alternative embodiment for the isolated channel.
Figure 6:
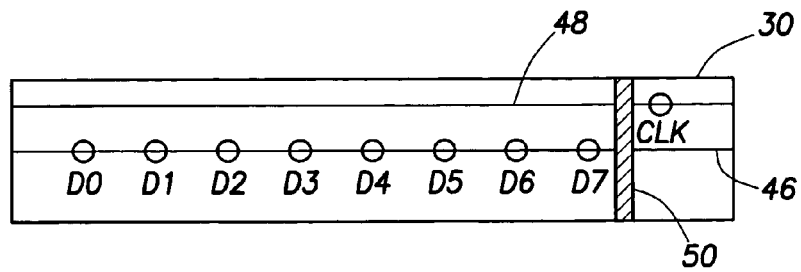
FIG. 6 shows yet another alternative embodiment for the isolated channel.
Figure 7:
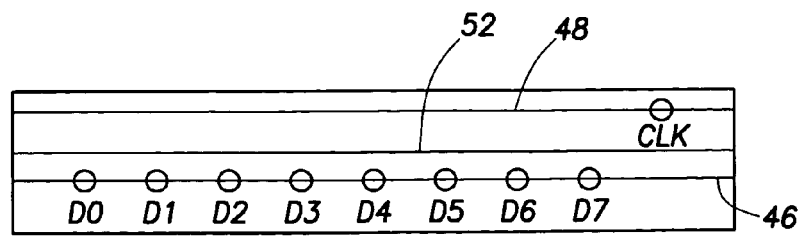
FIG. 7 shows a further alternative embodiment for the isolate channel.

In yet another embodiment, FIG. 5 shows an isolated clock channel that may be formed on a different layer 48 from the data channels D0–D7 that are on layer 46. The vertical separation between layers 48 and 46, as well as the horizontal separation between the clock channel and data channels, may help to minimize the potential for crosstalk contamination of the clock channel. A ground trace 42 also may be included to separate the clock channel-as shown in FIG. 5 or a silicon oxide barrier 50 may be included as shown in FIG. 6. Alternatively, as shown in FIG. 7, a ground plane 52 may be included to separate the layer 48 on which the clock channel may be formed from the layer 46 on which the data channels D0–D7 are formed.

The FET switch assembly with isolated channel described above may be used in a computer system 100 comprising a central processing unit ("CPU") 102, bridge logic 104, memory 106, input/output devices (e.g., display 112, keyboard 146, mouse 148) and other logic coupled together. See e.g., U.S. Pat. No. 6,401,157, incorporated herein by reference, for an exemplary computer system embodiment. The FET switch assembly may be implemented on an expansion bus usable for add-in cards as is commonly known.

Figure 8:
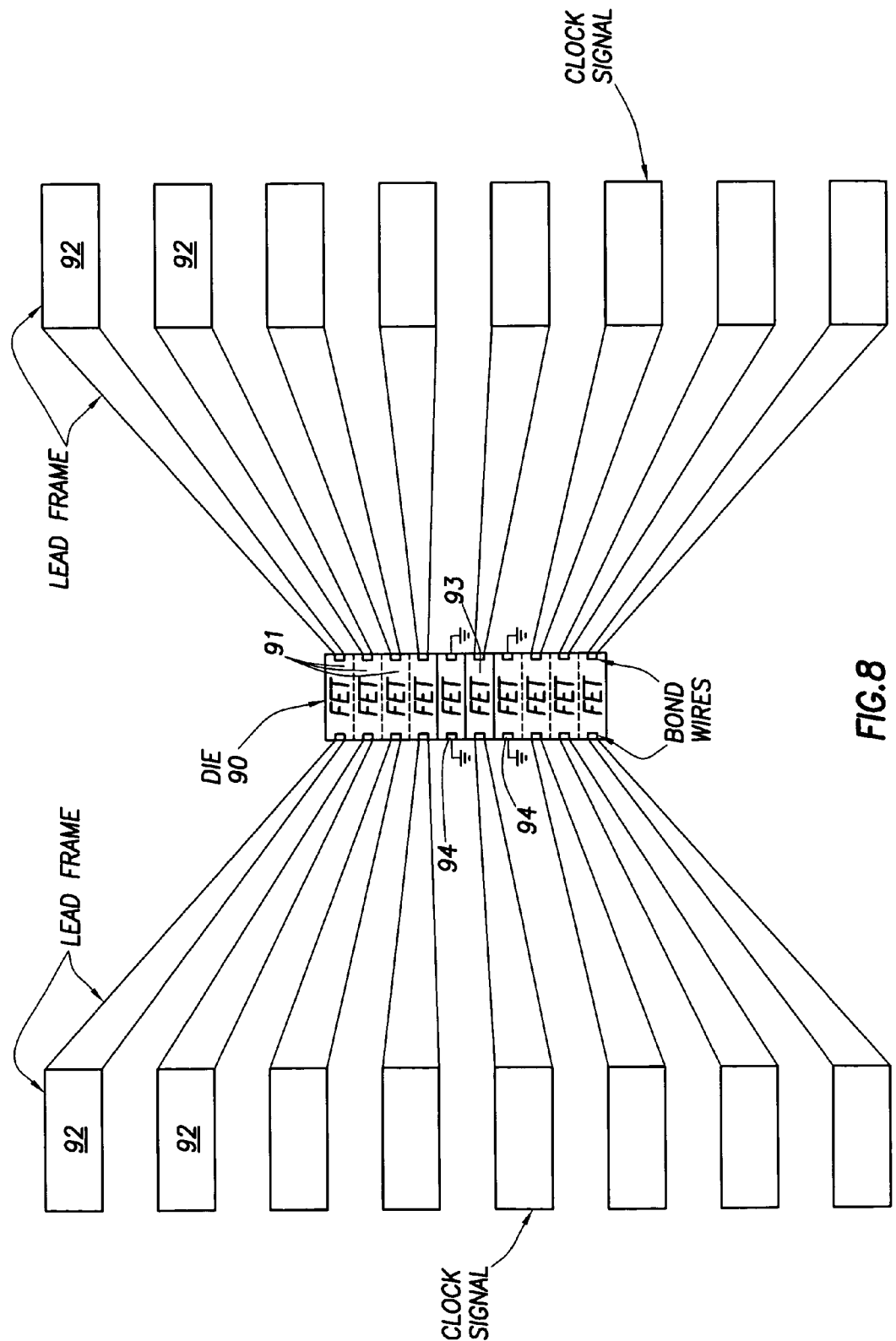
FIG. 8 shows a bond option embodiment alternative.
Figure 9:
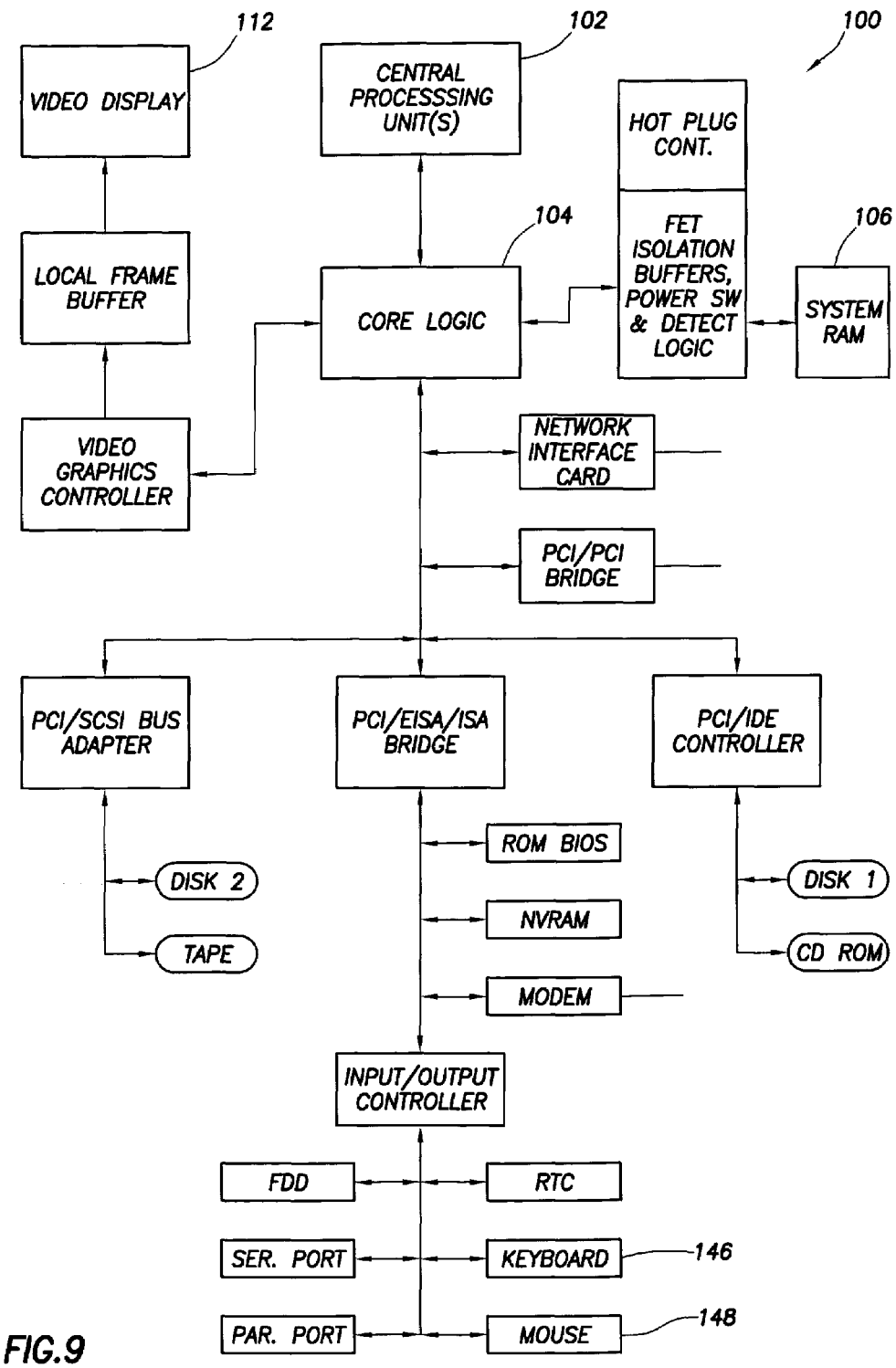
FIG. 9 illustrates an exemplary computer system.

Referring now the FIG. 8, a semiconductor die 90 may comprise a plurality of FET switches 91. The die 90 may couple to a plurality of lead frames 92. In the example of FIG. 8, a FET switch 93 is disposed between two FET switches 94, as shown, to isolate switch 93 from the other switches on the die 90. The inputs and outputs of switches 94 may be tied to a reference voltage (e.g., ground or a positive voltage), effectively precluding switches 94 from being used as switches and functioning to isolated switch 93 from the other switches 91 on the die 90.

The FET switch assembly described above includes at least one channel that is isolated from other channels to minimize or prevent crosstalk contamination of the isolated channel. The above discussion is meant to be illustrative of the principles and various embodiments of the present invention. Numerous variations and modifications will become apparent to those skilled in the art once the above disclosure is fully appreciated. For example, more than one isolated channel can be included in the FET switch assembly. Further, although the clock channel is considered the isolated channel in the discussion above, it could also be said that the data channels are isolated from the clock channel. Thus, any noise from the clock channel will be prevented, or reduced, from interfering with the data channels. Further still, the use of the isolated channel can be for any desired signal, not just a clock signal. Also, all of the aforementioned isolation techniques can be implemented together to provide the desired isolation. The various embodiments described herein are not limited to just FET switch assemblies and can be extended to other types of integrated circuits in which crosstalk is a concern between channels or signals in the same device. It is intended that the following claims be interpreted to embrace all such variations and modifications.

What is claimed is:

1. An integrated circuit, comprising:
   a first transistor;
   a second transistor; and
   a third transistor;
   wherein said second transistor is disposed between said first and third transistors, and terminals of said first and third transistors are grounded precluding said first and third transistors from being used as switches and providing isolation for said second transistor.

2. The integrated circuit of claim 1 further including a fourth transistor that provides data through the integrated circuit and the second transistor is immune from cross talk from said fourth transistor.

3. The integrated circuit of claim 1 wherein input and output terminals of said first and third transistors are grounded.

4. A FET switch assembly having inputs and outputs, comprising:
   a plurality of data channels providing data signals from the inputs to the outputs;
   a clock channel providing a clock signal from an input to an output;
   said data and clock channels formed on a semiconductor die; and
   said clock channel is located between two switches tied to a reference voltage, thereby isolating said clock channel from at least one said data channel.

5. The FET switch assembly of claim 4 wherein said reference voltage is ground.

6. The FET switch assembly of claim 4 wherein said reference voltage is a positive voltage.

7. A method of providing a transistor switch integrated circuit, comprising:
   providing a clock channel comprising a transistor;
   providing a plurality of data channels, each comprising a transistor; and
   providing, on opposite sides of said clock channel, at least two transistors tied to a reference voltage to thereby reduce crosstalk between said clock channel and said data channels.

8. The method of claim 7 wherein said reference voltage is ground.

9. The method of claim 7 wherein said reference voltage is a positive voltage.

10. An Integrated circuit, comprising:
    a plurality of first channels that receives externally generated signals as inputs and provides those signals as outputs;
    a second channel that receives an externally generated signal as an input and provides that signal as an output; and
    means for sandwiching said second channel between two transistors connected to a fixed electrical potential to thereby isolate said second channel.

11. The integrated circuit of claim 10 wherein said fixed electrical potential is ground.

12. A computer system, comprising:
a CPU;
memory;
bridge logic coupled to said CPU and memory;
a FET switch assembly coupled to said bridge logic and having inputs and outputs and including:
   a plurality of data channels providing data signals from inputs to outputs;
   a clock channel providing a clock signal from an input to an output;
   said data and clock channels formed on a semiconductor die; and
   said clock channel is isolated from said data channels by at least two switches that sandwich said clock channel and that are tied to a reference voltage.

13. The computer system of claim 12 wherein said reference voltage is a ground voltage.

14. The computer system of claim 12 wherein said reference voltage is a positive voltage.

* * * * *